US006201269B1

(12) United States Patent
Takano et al.

(10) Patent No.: US 6,201,269 B1
(45) Date of Patent: Mar. 13, 2001

(54) JUNCTION FIELD EFFECT TRANSISTOR AND METHOD OF PRODUCING THE SAME

(75) Inventors: Chiaki Takano; Hidetoshi Kawasaki; Masaru Wada, all of Kanagawa (JP)

(73) Assignees: Sony Corporation; Sony Chemicals Corporation, both of Tokyo (JP)

( * ) Notice: Subject to any disclaimer, the term of this patent is extended or adjusted under 35 U.S.C. 154(b) by 0 days.

(21) Appl. No.: 08/458,724

(22) Filed: Jun. 2, 1995

(30) Foreign Application Priority Data

Jun. 10, 1994 (JP) .................................................. 6-152859

(51) Int. Cl.$^7$ .............................. H01L 29/76; H01L 29/94
(52) U.S. Cl. .............................................................. 257/280
(58) Field of Search ............................................. 257/280

(56) References Cited

U.S. PATENT DOCUMENTS

| 4,237,473 | 12/1980 | Chiang . |
| 5,291,049 | 3/1994 | Morita . |

FOREIGN PATENT DOCUMENTS

| 158752 | 11/1985 | (EP) . |
| 58220464 | 12/1983 | (JP) . |
| 2119265 | 7/1990 | (JP) . |

*Primary Examiner*—Stephen D. Meier
(74) *Attorney, Agent, or Firm*—Ronald P. Kananen; Rader, Fishman & Grauer

(57) ABSTRACT

For suppressing generation of leakage current and side-gate effect in a junction field effect transistor, a gate extension is formed on a semi-insulative compound semiconductor substrate in a manner to extend from a gate and to protrude outward beyond a channel transversely thereto, and an insulating layer is formed on the semi-insulative compound semiconductor substrate under the gate extension. A method of producing this transistor comprises the steps of first forming a channel and a source-drain on a substrate, then forming a gate on the channel together with a gate extension which extends from the gate and protrudes outward beyond the channel transversely thereto, and forming an insulating layer adjacently to the channel and the source-drain in such a manner that no gap is existent between the insulating layer and at least the channel.

10 Claims, 10 Drawing Sheets

JUNCTION FIELD EFFECT TRANSISTOR AND METHOD OF PRODUCING THE SAME

BACKGROUND OF THE INVENTION

1. Field of the Invention

The present invention relates to a junction field effect transistor formed on a semi-insulative compound semiconductor substrate, and also to a method of producing such a transistor.

2. Description of Related Art

Remarkable development is currently in progress with regard to an integrated circuit which is formed on a semi-insulative compound semiconductor substrate composed of GaAs and is adapted for high-speed operation in a gigahertz band of microwave or millimetric wave region. Furthermore, it is presently observed that such integrated circuits are beginning to be employed as an amplifier circuit for a portable telephone or the like using a frequency band of 1 GHz or so. This integrated circuit usually consists of MES field effect transistors or junction field effect transistors.

A conventional n-type junction field effect transistor formed on a semi-insulative compound semiconductor substrate is shown in FIG. 1. FIG. 1A is a typical plan view, and FIGS. 1B and 1C are typical partially sectional views taken along lines B—B and C—C in FIG. 1A, respectively. It is to be understood that, in some cases hereinafter, such a semi-insulative compound semiconductor substrate will be referred to simply as a substrate, and an ordinary n-type junction field effect transistor will be referred to simply as a field effect transistor in the following description.

An explanation will be given on the summary of a method for production of a conventional n-type junction field effect transistor according to the related art. Although a gate electrode and a source-drain electrode are formed in the field effect transistor, these electrodes are omitted in the diagrams. Further in a diode and a resistance element, there are formed electrodes and terminals as well. However, these are also omitted in the diagrams.

First a source-drain 12 composed of an $n^{++}$-type conductive region is formed by implanting silicon ions into a substrate 10 of GaAs where a photo mask is formed. Thereafter a channel 11 composed of an $n^+$-type conductive region is formed by removing the above photo mask, then forming another photo mask, and implanting silicon ions again into the substrate 10. Subsequently, annealing is executed to activate the ion-implanted silicon which is an n-type impurity.

Next, an insulating film of, e.g., SiN (silicon nitride) is formed by CVD or the like on the entire surface including the channel 11 and the source-drain 12, and then an opening is formed in the insulating film above the channel 11 by the techniques of photolithography and etching. Thereafter a gate 13 composed of a $p^{++}$-type conductive region is formed by diffusing zinc into the channel 11 through a heating process while causing a gas, which includes diethyl zinc (DEZ), to flow into the opening formed in the insulating film. In this step, the gate 13 is so formed as to protrude outward beyond the channel 11. More specifically, there is formed a gate extension 13A which protrudes beyond the channel 11 transversely thereto. When the width of the gate 13 is changed with respect to the channel 11, a current flowing in the field effect transistor is also changed. Accordingly, in order to attain a sufficient margin in the process of producing a field effect transistor, the structure thereof is so contrived that the gate 13 protrudes outward beyond the channel 11.

Subsequently an element isolating region 20 is formed for the purpose of ensuring a required electric insulation between mutually adjacent field effect transistors. The element isolating region 20 is formed by implanting boron ions into a substrate region where any field effect transistor is not existent, hence obtaining the structure of FIG. 1.

In the method of producing such a conventional n-type junction field effect transistor, when boron ions are implanted at the above processing step, the element isolating region 20 is spaced apart by 0.3 μm to 1.0 μm from the channel 11 and the source-drain 12, as shown in FIGS. 1A, 1B and 1C. Reference numeral 21 denotes a region formed between the element isolating region 20 and both of the channel 11 and the source-drain 12. A portion 13B of the gate extension 13A of the gate 13 protruding outward beyond the channel 11 is in a state not overlapping the element isolating region 20. The distance from the channel 11 to the element isolating region 20 is dependent solely on the positioning precision of the photo mask at the time of forming the element isolating region 20 by ion implantation.

Due to the existence of such portion 13B of the gate extension 13A, there arises a problem that one field effect transistor is adversely affected by another field effect transistor adjacent thereto. More specifically, as shown in a typical partially sectional view of FIG. 2, when a positive voltage is applied to a gate 13 of an adjacent field effect transistor while a negative voltage is applied to a source-drain 12 of one field effect transistor, a nonnegligible current comes to flow between one field effect transistor and the adjacent transistor. Hereinafter this current will be referred to as a leakage current. Such a phenomenon is usually termed side-gate effect or back-gate effect. Concretely, a leakage current flows from a portion 13B of the gate extension 13A of the adjacent field effect transistor via the region 21 and an area under the element isolating region 20 to the source-drain 12 of one field effect transistor. In FIG. 6, a dotted line represents exemplary current-to-voltage characteristic between the source-drain 12 of one field effect transistor and the gate 13 of the adjacent field effect transistor in an example where the element isolating region 20 is spaced apart by 0.3 μm from the channel 11 (i.e., where the region 21 has a width of 0.3 μm). In FIG. 6, the ordinate signifies the current I (unit: nanoampere) flowing between the source-drain 12 of one field effect transistor and the gate 13 of the adjacent field effect transistor; while the abscissa signifies the voltage difference V (unit: volt) obtained by subtracting the voltage, which is applied to the source-drain 12 of the adjacent field effect transistor, from the voltage applied to the gate 13 of one field effect transistor.

Thus, when a leakage current flows between one field effect transistor and the adjacent field effect transistor, the performance characteristics thereof are adversely affected. It is therefore necessary to minimize such leakage current.

In case a diode is existent adjacently to a field effect transistor, a leakage current flows from a portion 13B of a gate extension 13A of the field effect transistor via a region 21 and an area under an element isolating region 20 to an n-type conductive region 23 of the adjacent diode (as shown in a typical diagram of FIG. 3A). Denoted by reference numeral 24 in FIG. 3A is a p-type conductive region.

In another case where a resistance element composed of an n-type conductive region 25 is existent adjacently to a field effect transistor, a leakage current flows from a portion 13B of a gate extension 13A of the field transistor via a region 21 and an area under an element isolating region 20 to an n-type conductive region 25 of the adjacent resistance element (as shown in a typical diagram of FIG. 3B). Generation of such leakage current is not desired either in view of the operation stability of the junction field effect transistor.

SUMMARY OF THE INVENTION

It is an object of the present invention to provide a junction field effect transistor formed on a semi-insulative compound semiconductor substrate, and also a method of producing such a transistor wherein generation of a leakage current and side-gate effect can be suppressed with a further advantage that harmful influence from any adjacent junction field effect transistor, diode or resistance element is minimized.

In a junction field effect transistor formed on a semi-insulative compound semiconductor substrate and having a channel, a gate and a source-drain, the object mentioned above can be attained by contriving an improvement where a gate extension protruding outward beyond the channel transversely thereto extends from the gate, and an insulating layer is formed on the semi-insulative compound semiconductor substrate under the gate extension.

In the junction field effect transistor of the present invention, there is embraced an aspect where the insulating layer overlaps at least the channel. The semi-insulative compound semiconductor substrate may be composed of GaAs, and boron may be included as an impurity in the insulating layer.

A method of producing the junction field effect transistor of the present invention for attaining the above object comprises the steps of: (a) forming a channel and a source-drain on a semi-insulative compound semiconductor substrate; (b) forming a gate on the channel together with a gate extension which extends from the gate and protrudes outward beyond the channel transversely thereto; and (c) forming an insulating layer on the semi-insulative compound semiconductor substrate adjacently to both of the channel and the source-drain in such a manner that no gap is existent between the insulating layer and at least the channel.

In the method of producing the junction field effect transistor of the present invention, the step (c) mentioned above may embrace an aspect where the insulating layer is formed adjacently to both of the channel and the source-drain in such a manner as to overlap at least the channel. The semi-insulative compound semiconductor substrate may be composed of GaAs, and the insulating layer may be formed by implanting boron ions.

In the present invention, the gate extension protrudes outward beyond the channel transversely thereto, and the insulating layer is formed on the semi-insulative compound semiconductor substrate under the gate extension. Therefore a flow of the leakage current from the gate extension to the adjacent junction field effect transistor, diode or resistance element is prevented by the insulating layer, hence effectively suppressing generation of the side-gate effect.

DETAILED DESCRIPTION OF THE PREFERRED EMBODIMENTS

Hereinafter some preferred embodiments of the present invention will be described in detail with reference to the accompanying drawings.

Figure 1A:
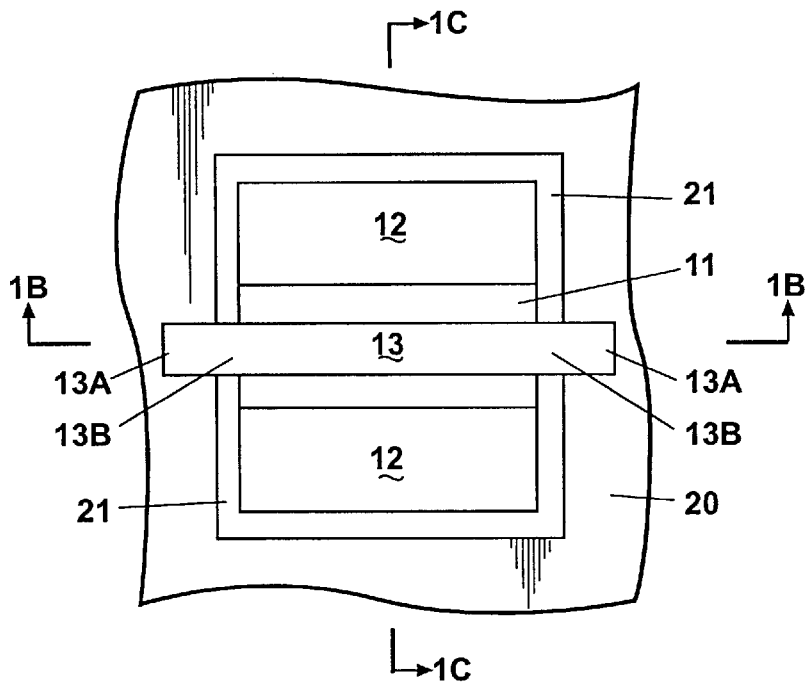
FIGS. 1A to 1C are a typical plan view and typical partially sectional views of a substrate and so forth for explaining a method of producing a conventional n-type junction field effect transistor according to the related art.
Figure 1B:
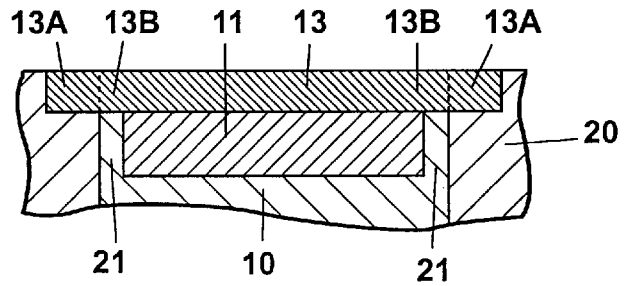
Figure 1C:
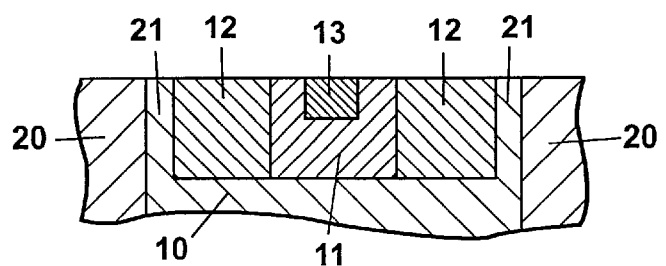
Figure 2:
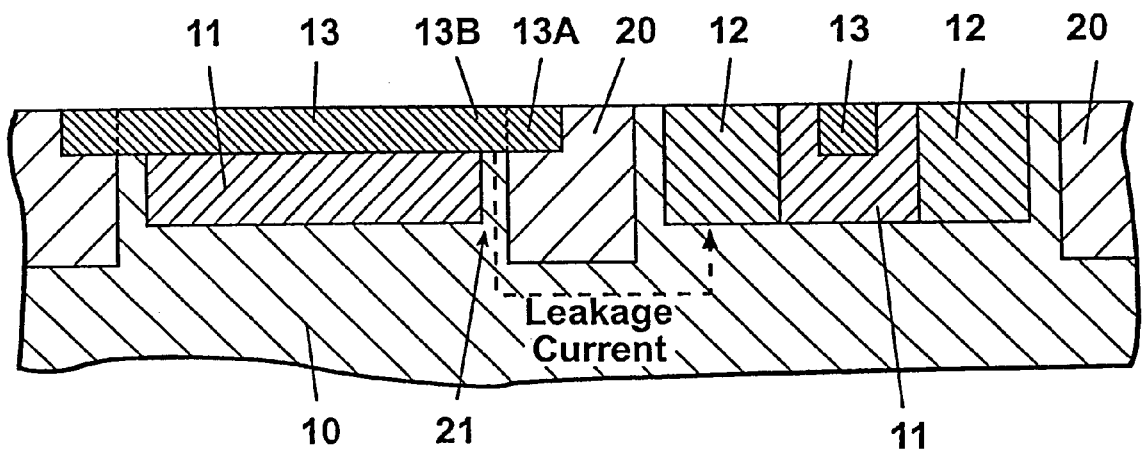
FIG. 2 is a typical partially sectional view for explaining the problems observed in the conventional n-type junction field effect transistor.
Figure 3A:
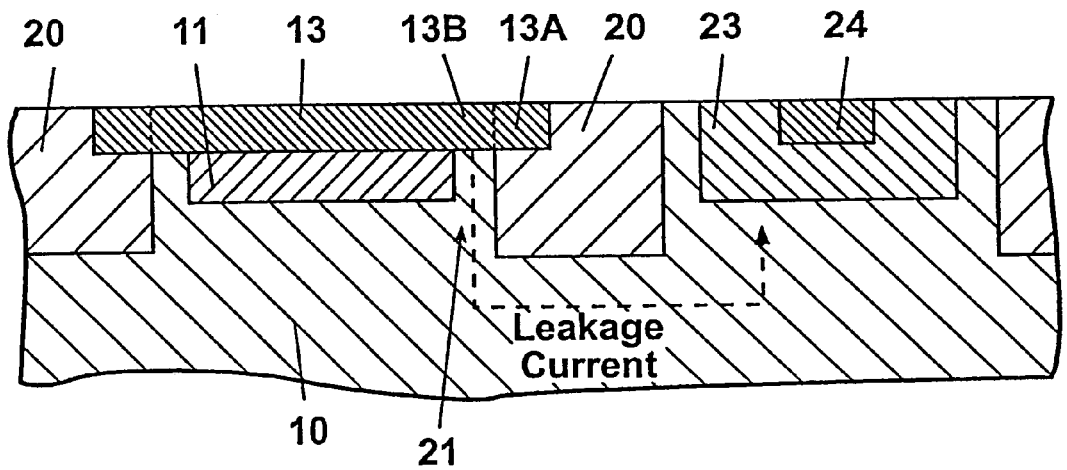
FIGS. 3A and 3B are diagrams for explaining the problems observed in a combination of a conventional junction field effect transistor and a diode, and also in a combination of a conventional junction field effect transistor and a resistance element.
Figure 3B:
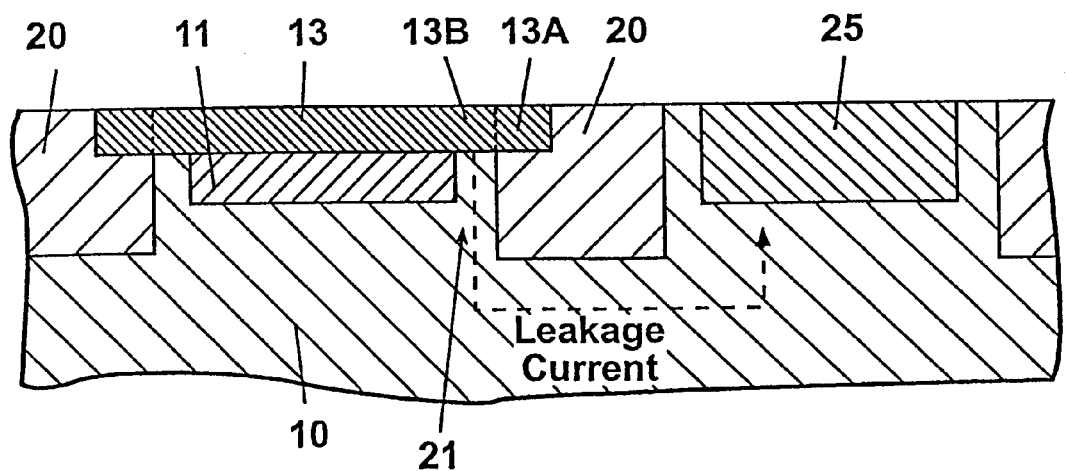
Figure 4A:
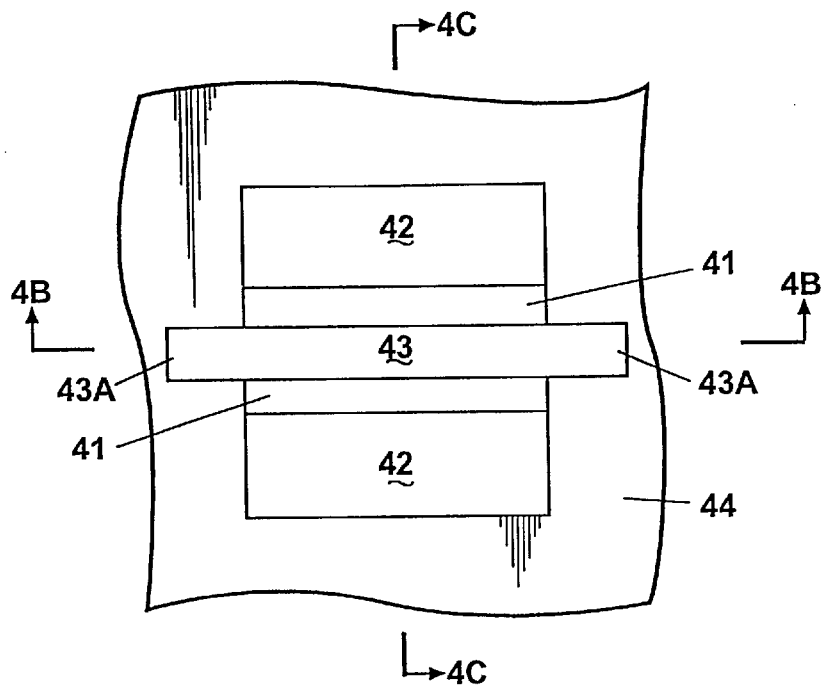
FIGS. 4A to 4C are a typical plan view and typical partially sectional views of a junction field effect transistor in a first embodiment of the present invention.
Figure 4B:
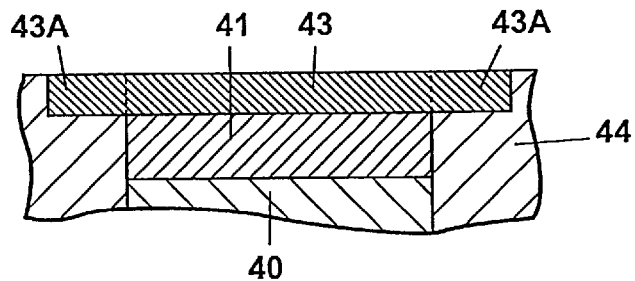
Figure 4C:
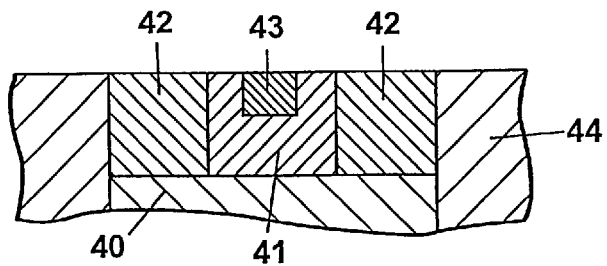

FIG. 4A is a typical plan view of a junction field effect transistor in a first embodiment of the present invention. And FIGS. 4B and 4C are typical partially sectional views taken along lines B—B and C—C in FIG. 4A showing the junction field effect transistor of the first embodiment.

The junction field effect transistor of the first embodiment is formed on an n-type or p-type semi-insulative compound semiconductor substrate 40. This transistor has a channel 41 composed of an $n^+$-type conductive region, a gate 43 of a $p^{++}$-type conductive region and a source-drain 42 of an $n^{++}$-type conductive region. A gate extension 43A protruding outward beyond the channel 41 extends transversely thereto from the gate 43. Practically, however, the gate extension 43A has no function as a gate. And an insulating layer 44 is formed on the semi-insulative compound semiconductor substrate 40 under the gate extension 43A which is a protruding portion of the gate. This insulating layer 44 functions also as an element isolating region.

In the junction field effect transistor of the present invention, no gap is formed, differing from the conventional junction field effect transistor, between the insulating layer 44, which corresponds to an element isolating region, and each of the channel 41 and the source-drain 42. Consequently, it becomes possible to prevent a flow of any great leakage current from the gate extension 43A of the gate 43 to the source-drain of an adjacent junction field effect transistor.

A method of producing the junction field effect transistor of the first embodiment will be described below with reference to FIG. 5, which is a typical partially sectional view taken along a line C—C in FIG. 4A.

[Step 100]

Figure 5A:
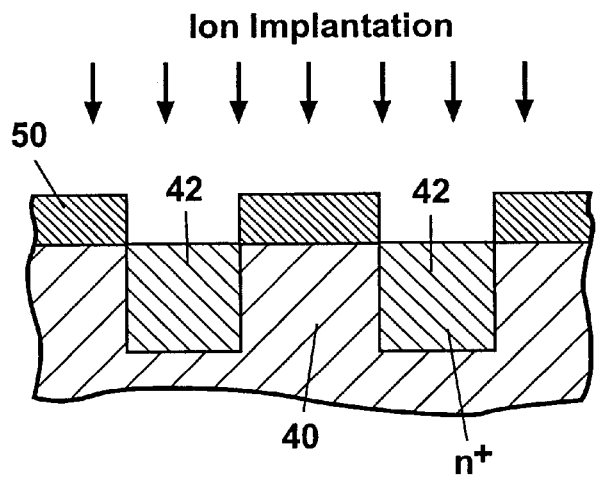
FIGS. 5A to 5C are typical partially sectional views of a semi-insulative compound semiconductor substrate and so forth for explaining a method which is a second embodiment of the present invention for production of the junction field effect transistor in the first embodiment.
Figure 5B:
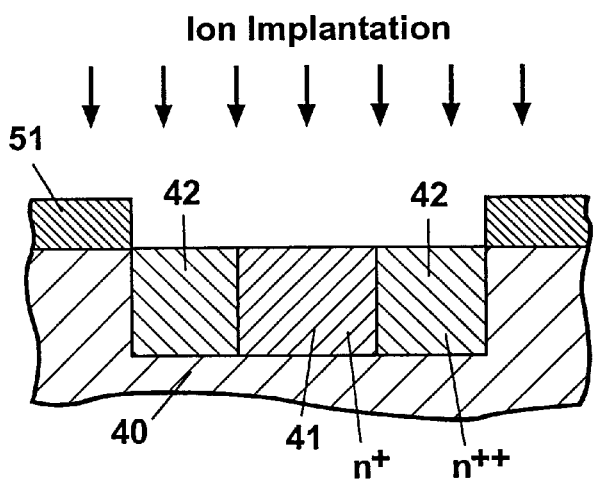

First a channel 41 and a source-drain 42 are formed on a semi-insulative compound semiconductor substrate 40 composed of GaAs. More specifically, a source-drain 42 of an $n^{++}$-type conductive region in the field effect transistor is formed by implanting silicon ions into a semi-insulative compound semiconductor substrate 40 of GaAs where a photo mask 50 is formed (as shown in FIG. 5A). Subsequently the photo mask 50 is removed and, after another photo mask 51 is formed again, silicon ions are implanted again into the semi-insulative compound semiconductor substrate 40, whereby the channel 41 of an $n^+$-type conductive region is formed (as shown in FIG. 5B). Thereafter the photo mask 51 is removed, and then an annealing process is executed to activate the ion-implanted silicon which is an n-type impurity.

[Step 110]

Figure 5C:
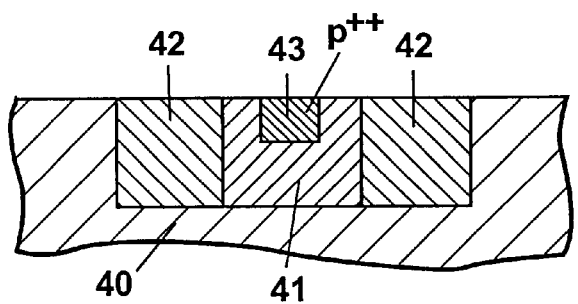

Subsequently a gate 43 is formed on the channel 41 together with a gate extension 43A which extends from the gate and protrudes outward beyond the channel 41 transversely thereto. For this purpose, first an insulating film (not shown) composed of SiN (silicon nitride) for example is formed by CVD or the like on the entire surface including the channel 41 and the source-drain 42, and then an opening is formed in the insulating film above the channel 41 by the techniques of photolithography and etching. Thereafter a gate 43 of a $p^{++}$-type conductive region is formed by diffusing zinc into the channel 41 through a heating process while causing a gas, which includes diethyl zinc (DEZ), to flow into the opening formed in the insulating film (as shown in FIG. 5C).

[Step 120]

Next an insulating layer 44 corresponding to an element isolating region is formed for the purpose of ensuring required electric insulation between mutually adjacent field effect transistors. The insulating layer 44 can be formed by first providing a photo mask which covers both of the channel 41 and the source-drain 42, and then implanting boron ions into a region of the semi-insulative compound semiconductor substrate 40 where neither the channel 41 nor the source-drain 42 is existent. In the first embodiment, the insulating layer 44 is formed on the semi-insulative compound semiconductor substrate 40 adjacently to the channel 41 and the source-drain in such a manner that no gap is formed between the insulating layer 44 and each of the channel 41 and the source-drain 42. Formation of such insulating layer 44 is dependent much on enhancement of the photo-mask positioning precision in the mass production line of semiconductor devices. The junction field effect transistor of FIG. 4 can thus be produced.

[Step 130]

Thereafter an insulating film composed of $SiO_2$ for example is formed by CVD or the like on the entire surface including the gate 43 and the source-drain 42, and an opening is formed in the insulating film above the gate and the source-drain by the techniques of photolithography and etching. Subsequently a metallic wiring material layer is deposited by sputtering or the like on the insulating film inclusive of such opening, and then wires are formed by patterning the metallic wiring material layer on the insulating film. As for suitable metallic wiring materials, Pt/Au may be used for the gate, and Au—Ge/Ni for the source-drain.

Figure 6:
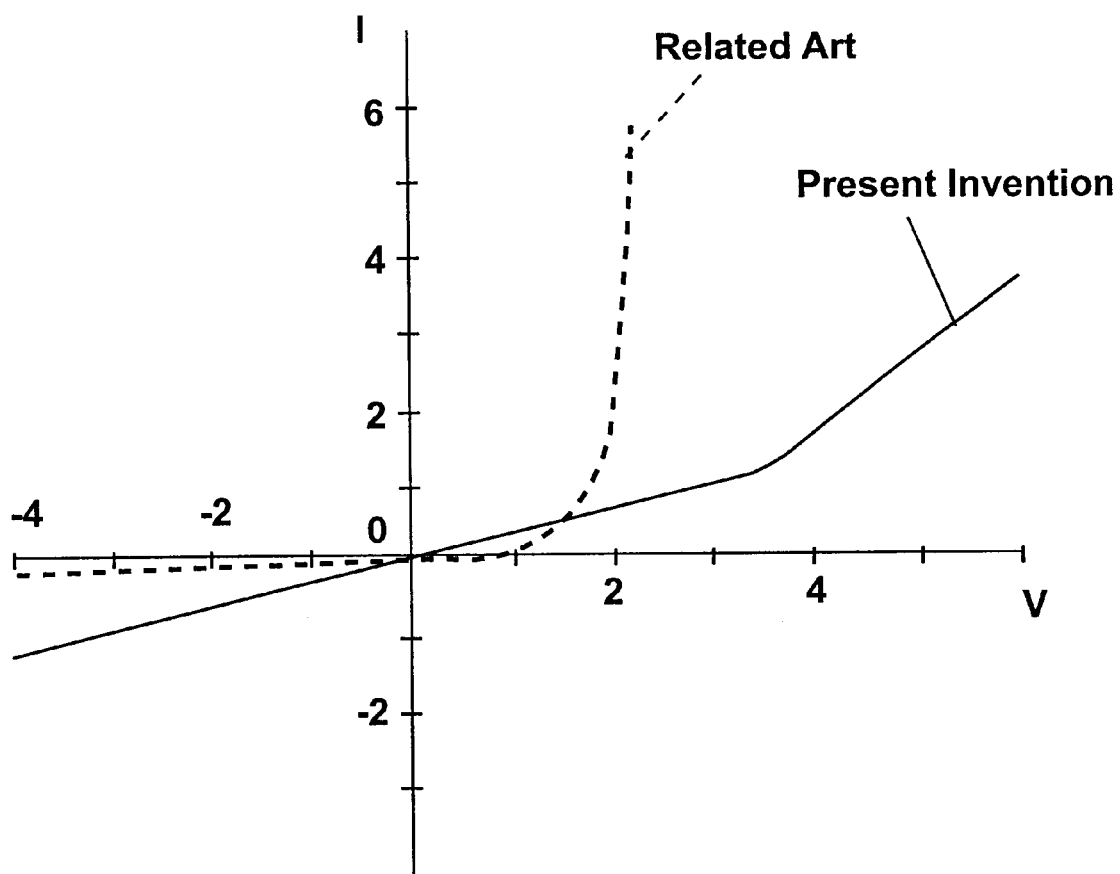
FIG. 6 graphically shows exemplary current-to-voltage characteristic of the junction field effect transistor in the first embodiment of the invention and that of the conventional transistor of the related art.

In FIG. 6, a solid line represents exemplary current-to-voltage characteristic obtained by applying a positive voltage to the gate 43 of one junction field effect transistor produced as mentioned while applying a negative voltage to the source-drain 42 of an adjacent junction field effect transistor. It is obvious therefrom that, in comparison with the other current-to-voltage characteristic represented by a dotted line and obtained in the conventional junction field effect transistor known heretofore, the leakage current is reduced remarkably in the junction field effect transistor of the first embodiment.

Figure 7A:
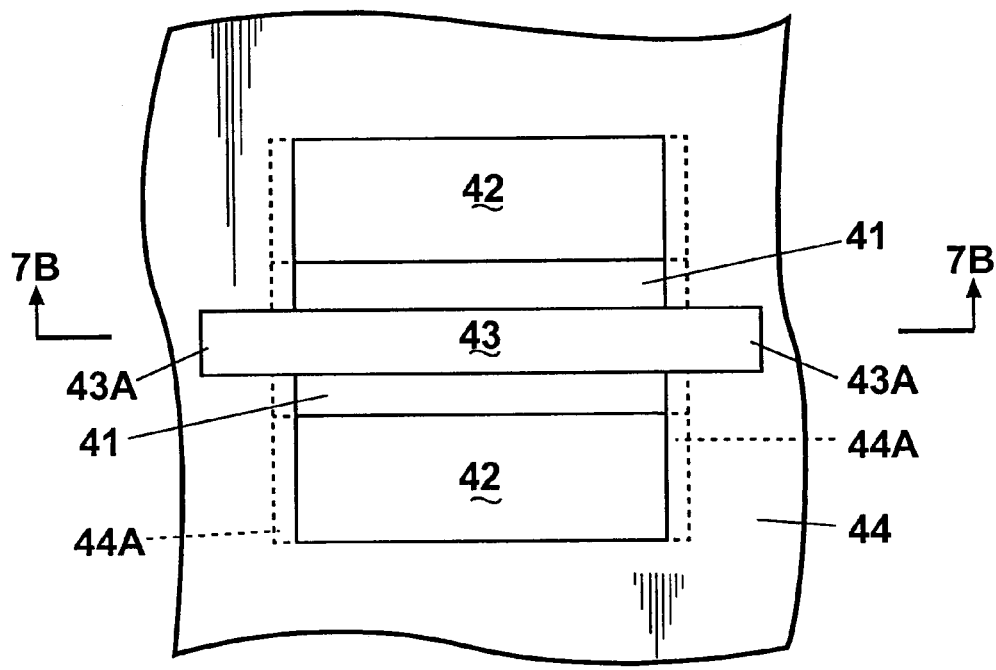
FIGS. 7A and 7B are a typical plan view and a typical sectional view of a junction field effect transistor in a third embodiment of the invention.
Figure 7B:
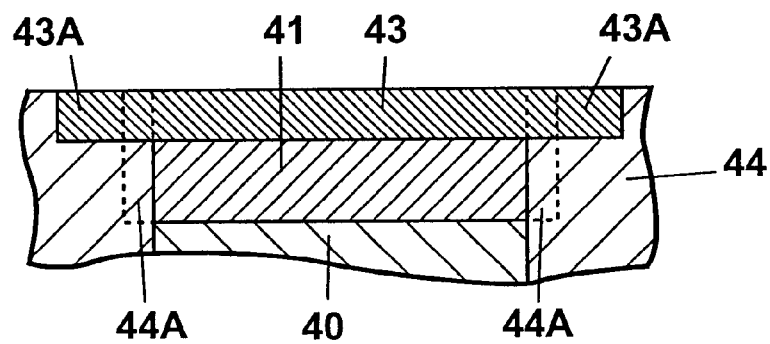

Hereinafter a second embodiment of the present invention will be described. In the first embodiment mentioned above, an insulating layer 44 is formed on a semi-insulative compound semiconductor substrate 40 adjacently to a channel 41 and a source-drain 42 in such a manner that no gap is existent between the insulating layer 44 and each of the channel 41 and the source-drain 42. As contrasted therewith, in the second embodiment shown in a typical plan view of FIG. 7A and a typical partially sectional view of FIG. 7B, a portion 44A of an insulating layer 44 overlaps a channel 41 and a source-drain 42. With the exception of this point, the junction field effect transistor of the second embodiment is structurally the same as that of the first embodiment. In the junction field effect transistor of the second embodiment, the channel width and so forth are designed with advance estimation of the overlap (invasion) of the insulating layer 44.

In a method of producing the junction field effect transistor of the second embodiment, an insulating layer 44 is formed adjacently to a channel 41 and a source-drain 42, at [step 120] relative to the first embodiment, in such a manner as to partially overlap the channel 41 and the source-drain 42. With the exception of this point, the junction field effect transistor of the second embodiment can be produced by the same method as that for production of the junction field effect transistor of the first embodiment.

Figure 8A:
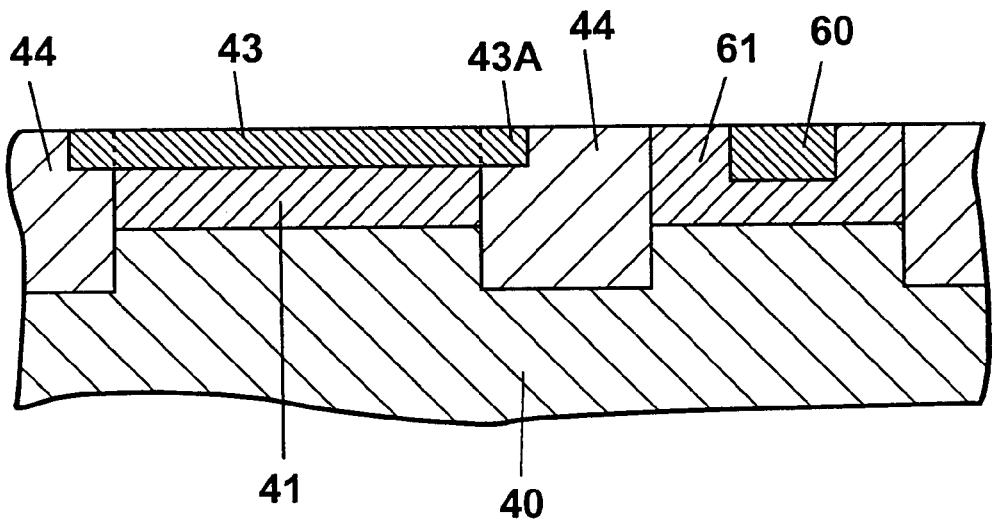
FIGS. 8A and 8B are typical partially sectional views showing structures of fourth and fifth embodiments of the present invention.

A third embodiment of the present invention will be described below. The third embodiment shown in a typical partially sectional view of FIG. 8A represents an example where the junction field effect transistor explained with regard to the first embodiment and a diode are formed adjacently to each other. The diode consists of an n-type conductive region 60 and a p-type conductive region 61. Fundamentally, such diode can be formed simultaneously with the source-drain and the gate of the junction field effect transistor in the production process thereof.

Figure 8B:
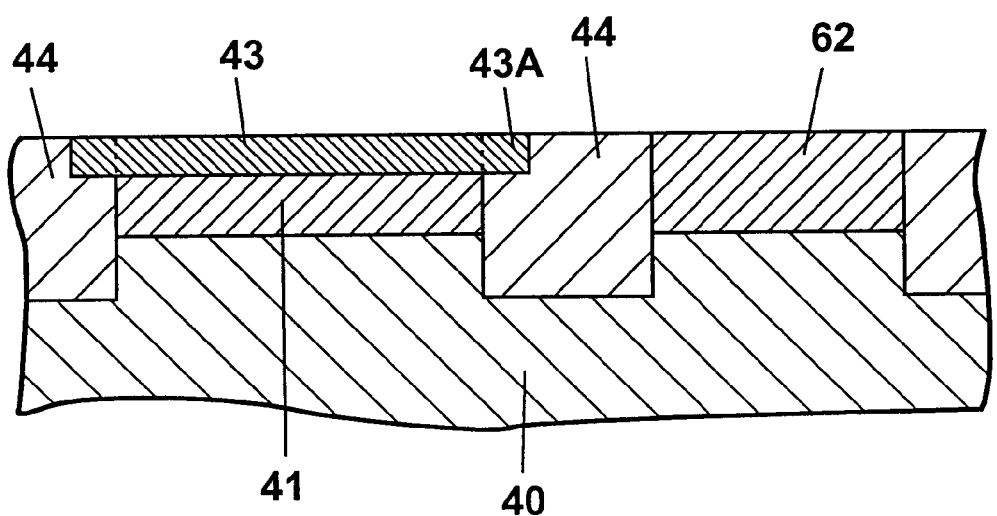

Next a fourth embodiment of the present invention will be described below. The fourth embodiment shown in a typical partially sectional view of FIG. 8B represents an example where the junction field effect transistor explained with regard to the first embodiment and a resistance element are formed adjacently to each other. The resistance element consists of an n-type conductive region 62. Fundamentally, such resistance element can be formed simultaneously with the source-drain of the junction field effect transistor in the production process thereof.

Although the present invention has been described above with reference to some preferred embodiments, it is to be understood that the present invention is not limited thereto alone.

Figure 9A:
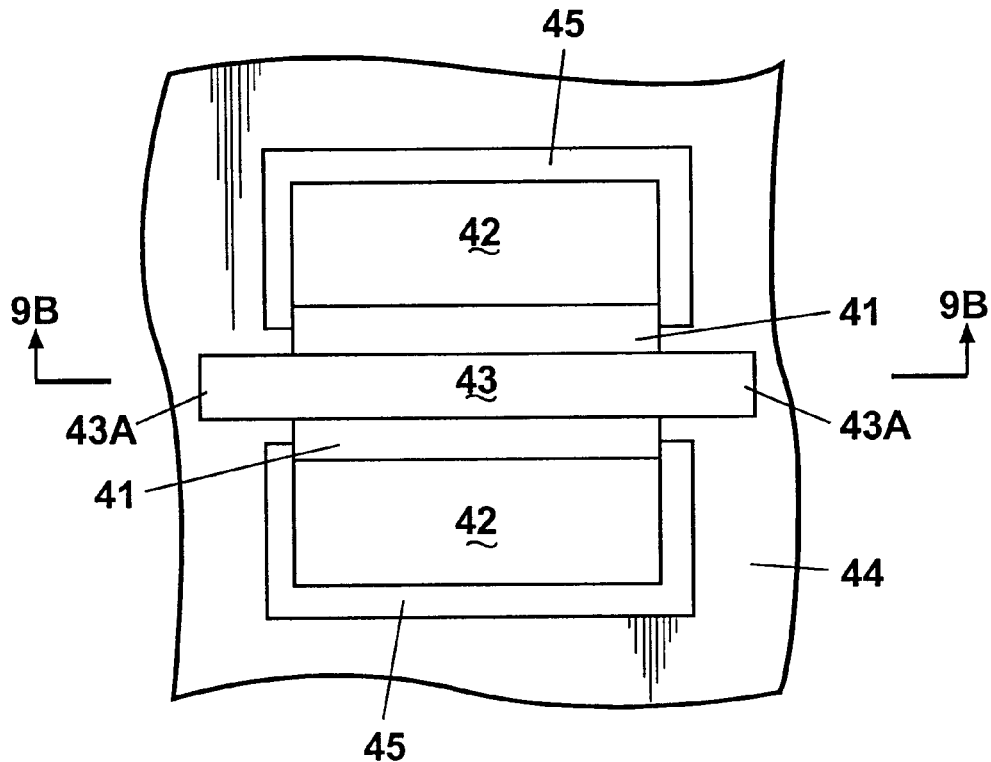
FIGS. 9A and 9B are a typical plan view and typical partially sectional views of a sixth embodiment of the invention which is a modification of the first embodiment.
Figure 9B:
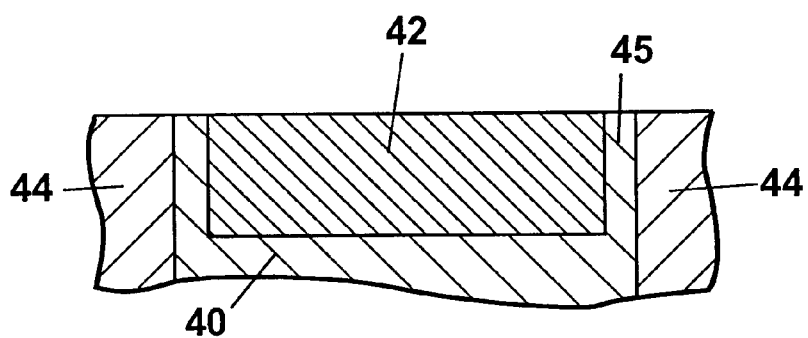

At [step 120] relative to the first embodiment, the insulating layer 44 is formed on the semi-insulative compound semiconductor substrate 40 adjacently to the channel 41 and the source-drain 42 in such a manner that no gap is existent between the insulating layer 44 and each of the channel 41 and the source-drain 42. However, the process may be so modified, at [step 120], as to form the insulating layer 44 on the semi-insulative compound semiconductor substrate 40 adjacently to the channel 41 and the source-drain 42 in a manner that no gap is existent between the insulating layer 44 and at least the channel 41. Such an example is shown in a typical plan view of FIG. 9A and a typical partially sectional view of FIG. 9B. In the example of FIG. 9, the insulating layer 44 is formed on the semi-insulative compound semiconductor substrate adjacently to the channel 41 and the source-drain 42 in a manner that no gap is existent between the insulating layer 44 and a portion of the channel 41. In other words, the requisite is satisfied if, as illustrated in FIG. 4B, the insulating layer 44 is formed exactly on the semi-insulative compound semiconductor substrate under the gate extension 43A which is a protruding portion of the gate. Reference numeral 45 denotes a gap formed between the other portion of the channel 41 and the insulating layer 44, and also between the source-drain 42 and the insulating layer 44. FIG. 9B is a typical partially sectional view taken along a line B—B in FIG. 9A.

Figure 10:
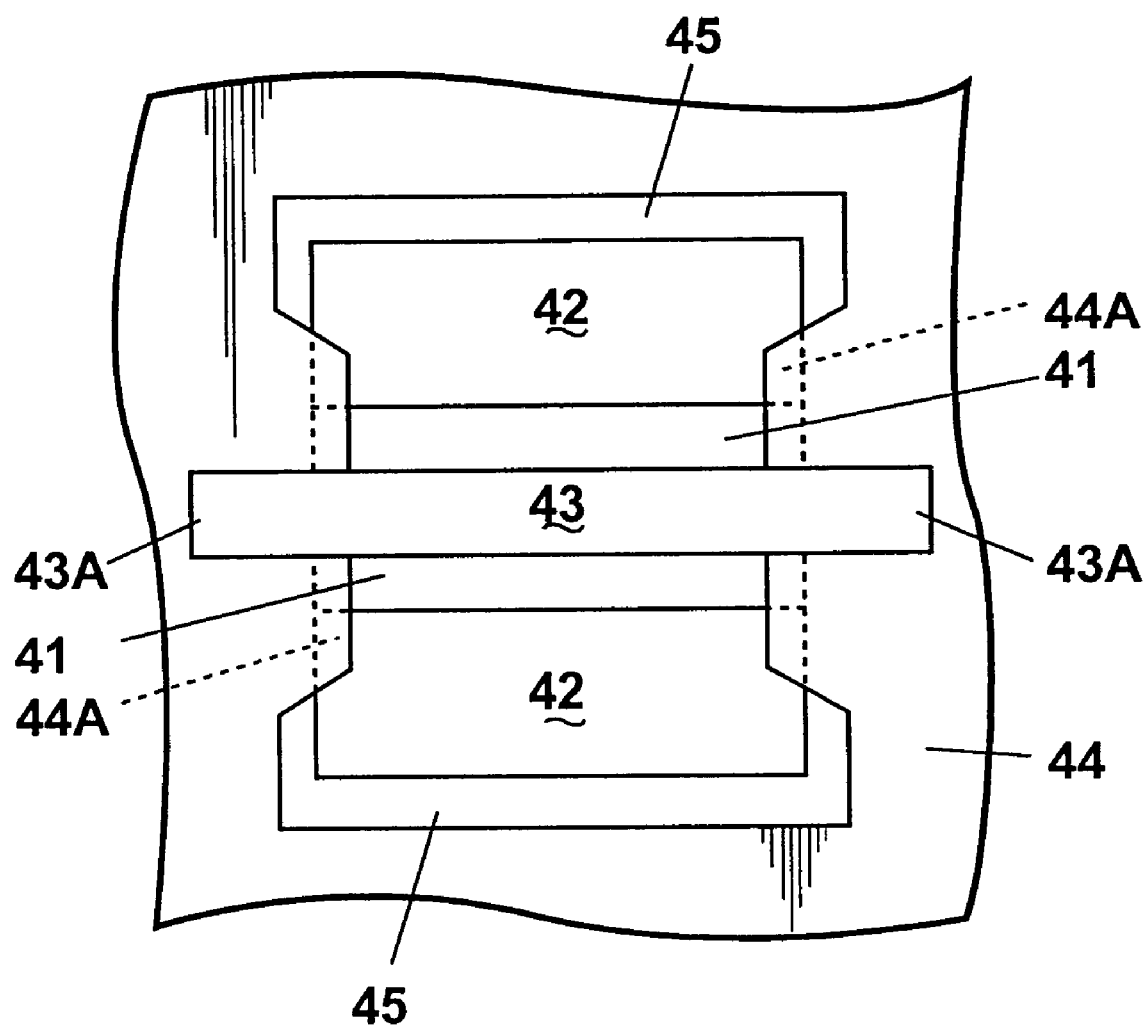
FIG. 10 is a typical plan view of a seventh embodiment of the invention which is a modification of the third embodiment.

Similarly in the second embodiment also, the requisite is satisfied if the insulating layer 44 exactly overlaps at least the channel 41, as shown in a typical plan view of FIG. 10. In this example, the insulating layer 44 is formed on the semi-insulative compound semiconductor substrate adjacently to the channel 41 and the source-drain 42 in a manner that the insulating layer 44 overlaps the channel 41 and a portion of the source drain 42. Reference numeral 45 denotes a gap formed between the other portion of the source-drain 42 and the insulating layer 44.

In each of the above embodiments, Si ions implanted to form a source-drain of an $n^{++}$-type conductive region may be replaced with Se ions. Further, diffusion of Zn for forming a gate of a $p^{++}$-type conductive region may be replaced with diffusion of C, Mg or Be, or with implantation of ions thereof. The insulating layer 44 can be formed by implantation of oxygen or hydrogen ions instead of implanting boron ions. Although an n-type junction field effect transistor has been described above as an example in each of the embodiments, the junction field effect transistor of the present invention may be a p-type one as well.

In the junction field effect transistor of the present invention, remarkable enhancement is achievable in the electric insulation and voltage withstanding characteristics between a gate of a p-type conductive region in this transistor and a source-drain of an n-type conductive region in an adjacent junction field effect transistor or an adjacent diode or resistance element. Therefore, the side-gate effect between this junction field effect transistor and the adjacent one is reduced to consequently decrease the leakage current flowing between the junction field effect transistor and the diode or the resistance element. As a result, it becomes possible to stabilize the operation of the junction field effect transistor with another advantage of raising the integration density of junction field effect transistors.

What is claimed is:

1. A junction field effect transistor comprising:
   a semi-insulative compound semiconductor substrate;
   a channel;
   a source-drain;
   a gate above said channel having a gate extension which extends from said gate and protrudes outward beyond said channel transversely thereto; and
   an insulating layer formed on said semi-insulative compound semiconductor substrate under said gate extension;
   wherein said insulating layer underlies all of said gate extension.

2. The junction field effect transistor according to claim 1, wherein said insulating layer overlaps at least said channel.

3. The junction field effect transistor according to claim 1 or 2, wherein said semi-insulative compound semiconductor substrate is composed of GaAs, and said insulating layer includes boron as an impurity.

4. The junction field effect transistor according to claim 2, wherein said insulating layer is so formed as to surround said source-drain and a partial region between said gate and channel while being in contact with the other region.

5. The junction field effect transistor according to claim 2, wherein said insulating layer is so formed as to surround a portion of said source-drain while being in contact with the other region.

6. The junction field effect transistor according to claim 5, wherein said insulating layer is so formed that the width thereof in said source-drain is greater than the width of the insulating film in said channel.

7. A junction field effect transistor comprising:
   a semi-insulative compound semiconductor substrate;
   a channel;
   a source-drain;
   a gate having a gate extension which extends from said gate and protrudes outward beyond said channel transversely thereto; and
   an insulating layer formed on said semi-insulative compound semiconductor substrate under said gate extension;
   wherein said insulating layer abuts an entire length of said channel which is not adjacent to said source-drain.

8. A transistor according to claim 7, wherein said insulating layer abuts an entire length of said channel and said source-drain.

9. A junction field effect transistor comprising:
   a semi-insulative compound semiconductor substrate;
   a channel;
   a source-drain;
   a gate having a gate extension which extends from said gate and protrudes outward beyond said channel transversely thereto; and
   an insulating layer formed on said semi-insulative compound semiconductor substrate under said gate extension;
   wherein portions of said insulating layer are formed in portions of said channel and said source-drain.

10. A transistor according to claim 9, wherein the portions of said insulating layer that are formed in portions of said channel and said source-drain cover an entire length of said channel and said source-drain.

* * * * *